June 13, 1967 C. A. NEUGEBAUER ET AL 3,325,307

METHOD OF FORMING SUPERCONDUCTIVE NIOBIUM FILMS

Filed Oct. 8, 1964 2 Sheets-Sheet 1

Inventors:
Constantine A. Neugebauer;
John R. Rairden,
by Paul R. Webb, II
Their Attorney.

June 13, 1967 C. A. NEUGEBAUER ET AL 3,325,307

METHOD OF FORMING SUPERCONDUCTIVE NIOBIUM FILMS

Filed Oct. 8, 1964 2 Sheets-Sheet 2

Inventors:
Constantine A. Neugebauer,
John R. Rairden,
by Paul R. Webb, II
Their Attorney.

3,325,307
METHOD OF FORMING SUPERCONDUCTIVE NIOBIUM FILMS

Constantine A. Neugebauer, Schenectady, and John R. Rairden III, Albany, N.Y., assignors to General Electric Company, a corporation of New York Filed Oct. 8, 1964, Ser. No. 404,558
4 Claims. (Cl. 117—213)

This application is a continuation-in-part of our copending application filed Aug. 28, 1963, as Ser. No. 305,097, and now abandoned, and assigned to the same assignee as the present application.

This invention relates to methods of forming metallic films on substrates and more particularly to methods of forming superconductive niobium films on beryllium substrates which superconductive niobium films become superconducting at a critical temperature no lower than the critical temperature of pure niobium.

As is well known, superconduction is a term describing the type of electrical current conduction existing in certain materials cooled below their critical temperature, $T_c$, where resistance to the flow of current is essentially non-existent. While the existence of superconductivity in many metals, metal alloys and metal compounds has been known for many years, the phenomenon has been more or less treated as a scientific curiosity until comparatively recent times. The awakened interest in superconductivity may be attributed, at least in part, to technological advances in the arts where their properties would be extremely advantageous in magnets, computers, generators, direct current motors, low frequency transformers, gyroscopes and to advances in cryogenics which removed many of the economic and scientific problems involved in extremely low temperature operations.

It is an object of our invention to provide a method of forming a superconductive niobium film on a beryllium substrate.

It is another object of our invention to provide a method of forming a superconductive niobium film on a beryllium substrate by forming a diffusion barrier coating on the substrate and by evaporating niobium metal onto the coated substrate.

It is a further object of our invention to provide a method of forming a superconductive niobium film on a beryllium substrate coated with a diffusion barrier of beryllium oxide or tungsten thereon.

In carrying out our invention in one form, a method of forming a superconductive film on a beryllium substrate comprises providing a beryllium substrate, forming a diffusion barrier coating on the substrate, positioning the coated substrate within a chamber, evacuating said chamber to a pressure in the range of $1\times10^{-9}$ to $5\times10^{-5}$ millimeters of mercury, positioning a niobium member within the chamber, heating at least a part of said member to at least its melting point, heating the coated substrate to a temperature in excess of 25° C., evaporating an initial portion of the resulting molten member within the chamber thereby gettering oxygen and oxygen compounds therein, and subsequently evaporating an additional portion of said molten member and condensing on the coated substrate a superconductive niobium film.

These and various other objects, features and advantages of the invention will be better understood from the following description taken in connection with the accompanying drawings in which.

Figure 1:
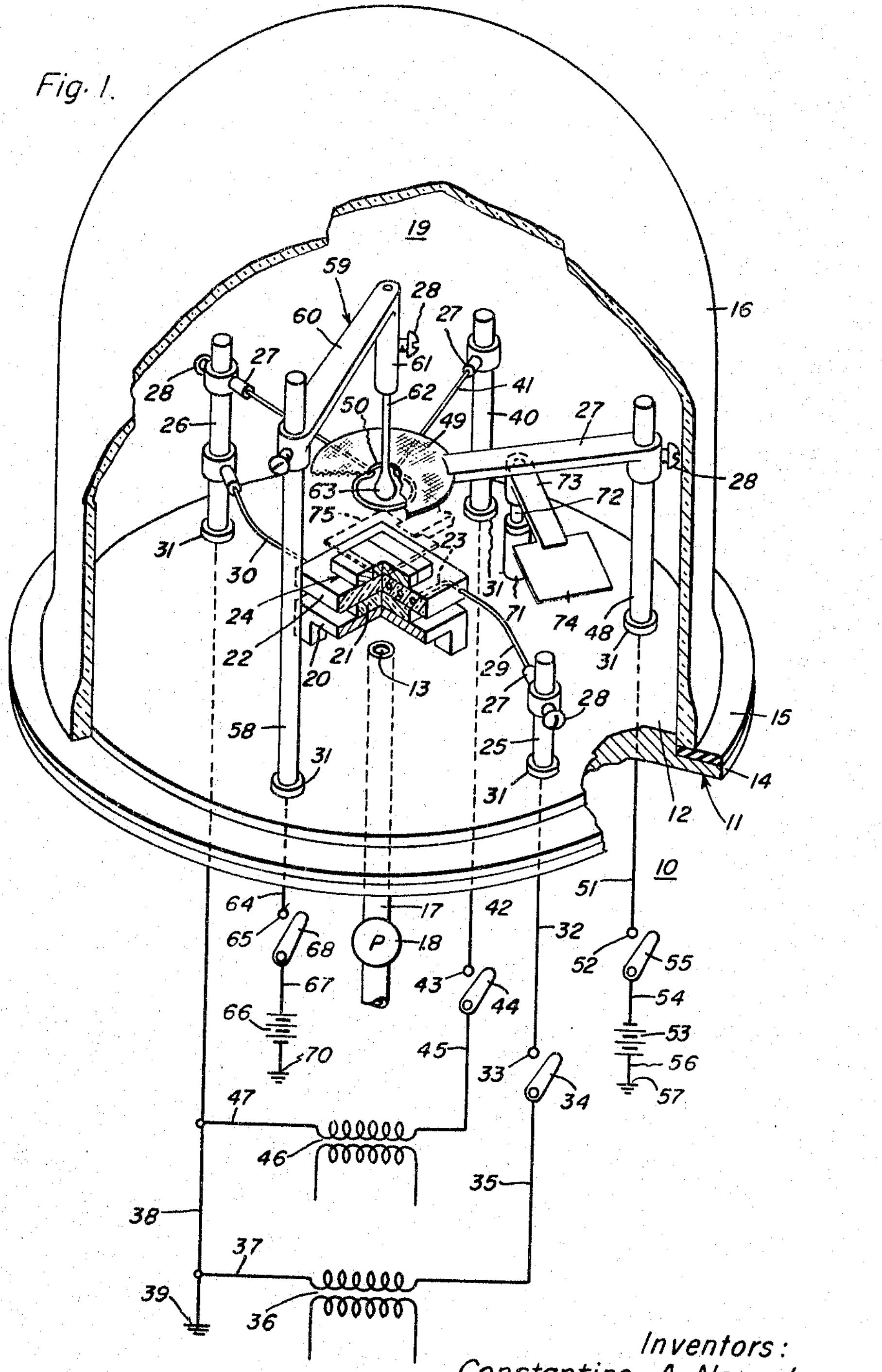
FIGURE 1 is a sectional view of apparatus for forming superconductive niobium films on coated beryllium substrates in accordance with our invention.

In FIGURE 1 of the drawing, apparatus is shown generally at 10 for forming superconductive niobium films on coated beryllium substrates which films will become superconducting at a critical temperature no lower than the critical temperature of pure niobium. A metal base 11 has a raised center portion 12 with a central aperture 13 therein and an outer rim 14 on which is positioned a rubber gasket 15. A glass bell jar 16 is positioned on gasket 15 adjacent the edge of center portion 12 of base 11. An evacuation line 17 is connected to aperture 13 and to a pump 18 to evacuate a chamber 19 defined by jar 16 and center portion 12 of base 11.

A metal member 20 including support legs is positioned over aperture 13. A block 21, such as, of quartz, mica or Vycor, a refractory material manufactured by Corning Glass Works, Corning, N.Y., is located on the top surface of member 20 to provide electrical insulation. A member 22 of quartz, mica or Vycor, which has a plurality of heating wires 23 embedded therein, is positioned on the upper surface of block 21 and extends beyond the edges of member 20 to prevent shorting during operation of the apparatus. A plurality of beryllium metal substrates 24, each of which has a beryllium diffusion barrier coating thereon, are arranged on the upper surface of member 22. The coating for substrate 24 will be described hereinbelow.

A pair of rods 25 and 26 each have an adjustable arm 27 with a set screw 28 to support leads 29 and 30 connected to heating wires 23. Each rod is supported in an electrically insulating sleeve 31 positioned in an aperture in portion 12 of base 11. A lead 32 from rod 31 has a terminal 33 which is contacted by a switch 34. A lead 35 is connected from a variable transformer 36 to switch 34. A second lead 37 is connected to a lead 38 grounded at 39. Lead 38 is connected to rod 26. Transformer 36, which is connected to a 115 volt A.C. current source, provides a 0–40 volt, 0–5 ampere range power source to heat wires 23 in member 22. The temperature of substrates 24 can be heated in this manner to values in excess of 1000° C.

A rod 40 supported in an electrically insulating sleeve 31 is also provided with an adjustable arm 27. A second arm 27 of rod 26 and arm 27 of rod 40 support a wire 41, for example, of tungsten therebetween. Wire 41 is shown in V-shape with a loop at the base of the V. A lead 42 from rod 40 has a terminal 43 which is contacted by a switch 44. A lead 45 is connected from a transformer 46 to switch 44. Another lead 47 connects transformer 46 to lead 38 which is grounded at 39. Lead 38 is connected to rod 26. Transformer 46, which is connected to a 115 volt A.C. current source, provides a 16 volt, 18 ampere power source for wire 41.

A rod 48 supported in an insulating sleeve 31 carries an adjustable arm 27 which positions a molybdenum wire mesh screen 49 above the loop of wire 41. An aperture 50 is located in the center of screen 49 which aperture is in axial alignment with the opening in the loop of wire 41. A lead 51 connects rod 48 to a terminal 52. The negative terminal of a D.C. power supply 53, for example, a 500 volt D.C. supply, is connected by a lead 54 to a switch 55 which contacts terminal 52. A lead 56 connects the positive terminal of power supply 53 to a ground 57. In this manner, screen 49 carries a potential of minus 50 volts.

A rod 58 supported in a sleeve 31 carries an L-shaped member 59 which has a portion 60 mounted adjustably on rod 58 by means of a set screw 28. A portion 61 of member 59 holds a rod 62 of a high melting point superconductive niobium by means of a set screw 28. At the free end of rod 62, there is shown a globule 62 of niobium which was formed during a previous melting of the tip of rod 62. Rod 62 is positioned within aperture 51 of screen 49 and the opening in the loop of wire 41 so that globule 62 is located slightly above or within the loop of wire 41. A lead 64 connects rod 58 to a terminal 65. The positive terminal of a 300 ma., 3000 v. varible D.C. power supply 66 is connected by a lead 67 to a switch 68 which contacts terminal 65. A lead 69 connects power supply 66 to a ground 70.

An insulating sleeve 71 positions a pivotal rod 72 with an arm 73 supported thereon. Rod 72 is moved from outside chamber 19 by any suitable means (not shown). Arm 73 secures a shield 74 in the form of a flat molybdenum sheet which is pivoted to a position shown by dotted lines 75.

Figure 2:
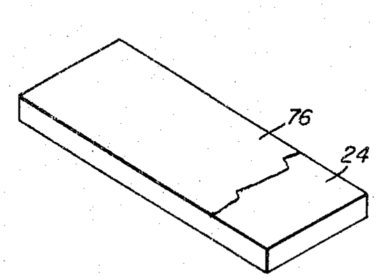
FIGURE 2 is a perspective view of a coated beryllium substrate.

In FIGURE 2 of the drawing, there is shown a beryllium substrate 24 as is disclosed in FIGURE 1 of the drawing. This substrate 24 has a diffusion barrier coating 76 of beryllium oxide thereon.

Figure 3:
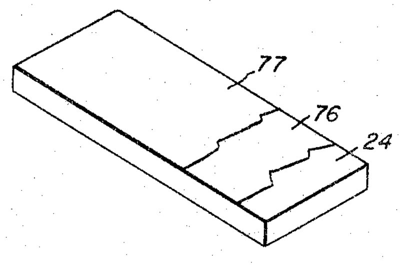
FIGURE 3 is a perspective view of a coated beryllium substrate with a superconducting niobium film thereon.

In FIGURE 3 of the drawing, there is shown a beryllium substrate 24 as is disclosed in FIGURES 1 and 2 of the drawing. This substrate 24 has a diffusion barrier coating 76 of beryllium oxide thereon and a superconductive niobium film 77 evaporated onto the coated surface of the substrate.

Figure 4:
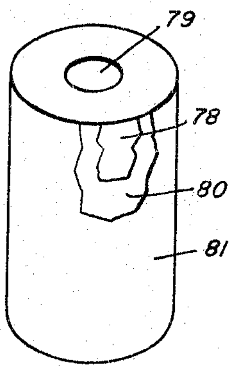
FIGURE 4 is a perspective view of a modified coated beryllium substrate with a superconducting niobium film thereon.

In FIGURE 4 of the drawing, there is shown a cylinder 78 of beryllium with a central aperture 79 therethrough. The exterior side wall of cylinder 78 has a diffusion barrier coating 80 of tungsten thereon and a superconductive niobium film 81 thereon. The cylinder was revolved around its axis during the evaporation of niobium thereon.

We discovered that a superconductive film could be formed on a beryllium substrate by forming a diffusion barrier coating such as beryllium oxide or tungsten on the substrate, positioning the substrate within a chamber, evacuating the chamber to a pressure in the range of $1\times10^{-9}$ to $5\times10^{-5}$ millimeters of mercury, positioning a niobium member within the chamber heating the coated substrate at a temperature in excess of 25° C., heating at least a part of the member to at least its melting point, evaporating an initial portion of the resulting molten member within the chamber thereby gettering oxygen and oxygen compounds therein, and subsequently evaporating an additional portion of the molten member and condensing on the coated substrate a superconductive niobium film.

We found that a suitable superconductive metal for evaporation in accordance with our method was niobium. This niobium member can include a second structurally supporting metal such as tungsten. We found that it is necessary to heat at least a part of the superconducting niobium metal member to at least its melting point or higher. This can be done by electron bombardment or by induction heating to produce a high rate of initial and subsequent evaporation. Only in this manner is there formed a film which becames superconducting at a critical temperature no lower than the critical temperature of pure niobium.

We found in the course of our research that niobium could be evaporated and condensed on a beryllium substrate, for example, by electron bombardment. However, the film would not adhere to the substrate. Secondly, we found that the deposited niobium film was contaminated by diffusion of beryllium into niobium resulting in an impure film which did not exhibit the superconductive properties of pure niobium when cooled below its critical temperature, $T_c$.

We discovered unexpectedly that if we formed a diffusion barrier coating on the beryllium substrate prior to the evaporation of the niobium film thereon, the film adhered to the substrate. No contamination resulted from the beryllium thereby producing a niobium film which exhibited the superconductive properties of pure niobium as shown by its becoming superconducting at a critical temperature no lower than the critical temperature of pure niobium. We found that beryllium oxide and tungsten were suitable diffusion barrier coatings for the beryllium substrate. The beryllium oxide coating could be formed on the beryllium by exposure to air or to other oxidizing atmosphere. The tungsten coating could be formed in various ways, such as by vapor depositing or sputtering the tungsten on the substrate.

In order to produce the superconductive niobium film on the above diffusion barrier coated beryllium substrates, we found that it is necessary to heat the substrate to a temperature in excess of 25° C. Normally, the heat generated by the molten portion of the superconductive niobium member heats the substrate to a temperature in excess of 25° C., and generally to a temperature of several hundred degrees Centigrade. We found further that if the substrate is not heated to a temperature in excess of 25° C., the film which is formed on the substrate will not exhibit the superconductive properties of pure niobium when cooled below its critical temperature. Such a film will become superconducting below the critical temperature of pure niobium.

In the above method of forming a superconductive niobium film on a substrate, as the rapid deposition rate is increased, a lower substrate temperature is tolerable in the process. The rate of deposition is defined as the number of metal atoms which impinge upon a square centimeter of substrate in a second. Since at least a part of the superconductive niobium member is heated to at least its melting point, the deposition rate can be increased by increasing the amount of molten niobium. Also, this rapid deposition rate can be varied by moving the substrate closer to or farther away from the molten portion of the niobium metal. The deposition rate can be also increased by increasing the temperature of the niobium member above its melting point. However, it is necessary to employ a substrate temperature in excess of 25° C. to produce in the deposited niobium film the superconductive properties of pure niobium when cooled below its critical temperature. If the substrate is sufficiently far away from the molten portion of the superconductive metal, it is then necessary to employ auxiliary heating of the substrate to have the substrate temperature in excess of 25° C. Normally, such auxiliary heating is unnecessary since the heat radiated from the molten portion of the superconductive niobium member will maintain the substrate at a temperatuer in excess of 25° C.

The electron bombardment or induction heating which is employed in the process to produce a high rate of initial and subsequent evaporation allows a higher residual gas pressure to be tolerated since the deposition rate is high. When an evacuation pressure range of $1\times10^{-9}$ to $5\times10^{-5}$ millimeters of mercury is employed, it is necessary that the oxygen and oxygen containing compounds such as $H_2O$, $CO$ and $CO_2$ be gettered or removed from the chamber. The material to be evaporated is employed in a sufficiently pure form to eliminate the production of additional oxygen or oxygen containing compounds. The evacuation system is also checked to be certain that there are no large leaks into the chamber where the evaporation process is taking place.

The third and most important source of oxygen containing compounds is from the residual gas within the chamber. When the chamber is evacuated, such oxygen compounds are not completely removed. If the evaporation takes place in such a chamber without removal of the oxygen from the oxygen containing compounds, a film of superconductive material can be evaporated onto a substrate but the film will not be superconductive when lowered below its critical temperature because if its relatively high impurity content.

The rapid evaporation of the niobium metal to be deposited and oxygen gettering by the metal to be evaporated will produce a niobium film which exhibits the superconductive properties of pure niobium when cooled below its critical temperature. This rapid evaporation and oxygen gettering are employed in the following manners to produce a superconductive niobium film. The material to be evaporated is not confined within an enclosure within the chamber but the material is allowed to evaporate over a large area including both the substrate and the interior of the chamber. In this manner, the material which is evaporated over this large area getters the oxygen and the oxygen containing compounds in the chamber. While the initial portion of material evaporated onto the substrate and onto the interior of the chamber is contaminated, the subsequent evaporation which is continuous with or interrupted from the initial evaporation of the material will reduce rapidly the level of oxygen and oxygen containing compounds to a tolerable level and will produce a niobium film on the substarte which exhibits the superconductive properties of pure niobium when cooled below its critical temperature.

Such oxygen gettering can also be accomplished in at least one other manner. A shield of metal, such as molybdenum, is positioned between the coated beryllium substrate and the niobium material to be evaporated within the evacuated chamber. The evaporation of the material is commenced whereupon the material will evaporate on both the shield and a substantial portion of the interior of the chamber without any deposit on the substrate. The evaporated material will getter the oxygen and the oxygen containing compounds present in the chamber. The shield is then moved away from its initial position whereupon niobium is evaporated on the coated beryllium substrate to produce a superconductive niobium film thereon. The employment of the shield is particularly advantageous when it is desired to produce a thin film of suporconductive material on the substrate. Of course, such operation may be used in the production of thicker substrate films.

In the operation of the apparatus shown in FIGURE 1 of the drawing, a plurality of beryllium substrates 24 in the form of bars 1 inch x 0.25 inch x 40 mils are positioned adjacent one another on a Vycor member 22 having a heating wire 23 embedded therein. These substrates were previously provided with a diffusion barrier coating of beryllium oxide of 0.001 inch thick by exposing the bars to air for a period of thirty minutes at 900° C. Member 22 is positioned on an electrically insulated block 21 which is supported on a metallic member 20. A tungsten wire 41 with a V-shaped configuration having a loop at its end is attached to arms 27 of rods 26 and 40. A niobium member in the form of rod 62 of ⅛ inch diameter is positioned in portion 61 of L-shaped member 59 supported on rod 58. Arm 27 of rod 48 supports a high temperature wire screen 49 of molybdenum having a central aperture 50 therein. The free end of rod 62 extends through aperture 50 and the aperture formed by wire 41 and is positioned slightly above or within the loop of wire 41. Bell jar 16 is positioned on rubber gasket 15 and its inner edge is adjacent to center portion 12 of base member 11. Pump 18 evacuates chamber 19 through exit line 17 to a pressure in the range of 1 x $10^{-9}$ to 5 x $10^{-5}$ millimeters of mercury. Coated beryllium substrates 24 are positioned approximately one inch from the end of rod 62.

Rod 48 is connected to the negative terminal of power source 53 by terminal 52 and switch 55 to provide a negative potential of minus 500 volts on the wire screen 49. Rod 58 is connected to the positive terminal of a 300 ma., 3000 volt variable direct current power supply 66 which is grounded from its opposite terminal. Transformer 46 is energized to provide, for example, a 16 volt 18 ampere source of electrons. Switch 44 is closed to contact terminal 43 whereupon the power from transformer 46 heats wire 41 to emit electrons. Switch 68 is closed providing a potential of the order of 150 volts on rod 62. Switch 55 is closed providing a negative potential of minus 500 volts on screen 49. The electrons from heated wire 41 are accelerated to the tip of rod 62 by the high voltage between rod 62 and wire 41. Screen 49 causes the electrons to focus on the tip portion of rod 62 which is heated to its melting point whereupon globule 63 forms at the tip of rod 62.

Maximum rate of evaporation is obtained by maintaining globule 63 at its melting point. A portion of niobium metal from globule 63 of rod 62 is evaporated rapidly on the interior surface of chamber 19 and on substrates 24. The initial evaporated metal getters oxygen and oxygen containing compounds within chamber 19. The subsequent evaporation of an additional portion of niobium metal and its condensation on the coated substrates forms a superconductive niobium film. Substrates 24 are maintained at a temperature of approximately 300° C. by the heat from globule 63 at the tip of rod 62. These substrates must be heated to a temperature of above 25° C. For example, a micron film of superconductive niobium is produced on the upper surface of each substrate in a period of forty minutes.

Switches 44, 55 and 68 are opened and chamber 19 is allowed to cool to room temperature. After chamber 19 is returned to atmospheric pressure, bell jar 16 is removed therefrom. The coated substrates 24 with superconductive niobium films thereon are then removed from chamber 19.

The operation of apparatus 10 is also performed in the above manner with additional gettering of oxygen and oxygen containing compounds during the evaporation of the niobium onto coated substrates 24. This is accomplished by pivoting rod 72 supported in insulated sleeve 71 by any suitable means (not shown) to position a molybdenum shield 74 between substrates 24 and rod 62. Wire 41 is heated to melt globule 63 as described above and niobium metal from rod 62 is evaporated rapidly on the interior surfaces of chamber 19 including shield 74 thereby increasing the amount of gettering of oxygen and oxygen containing compounds therein. The shield is then removed or moved away from its initial position so that rapid evaporation of an additional portion of niobium metal forms a superconductive film of niobium on diffusion barrier coated substrates 24.

As shown in FIGURE 2 of the drawing, a beryllium substrate 24 has a diffusion barrier coating of beryllium oxide thereon. The coating is formed, for example, by exposing substrates 24 to an air atmosphere.

As is shown in FIGURE 3 of the drawing, beryllium substrate 24 has a diffusion layer barrier 76 of beryllium oxide thereon and a superconductive film 77 of niobium evaporated on the coated substrate. This niobium evaporation is accomplished in the apparatus shown in FIGURE 1 of the drawing.

In FIGURE 4 of the drawing, a cylinder 78 of beryllium having a central aperture 79 therethrough has a diffusion barrier coating 80 of tungsten thereon and a superconductive film 81 of niobium thereon on its exterior sidewall. This niobium film is evaporated on the coated cylinder in the apparatus shown in FIGURE 1 of the drawing. During the process, cylinder 78 is rotated on its axis.

Figure 5:
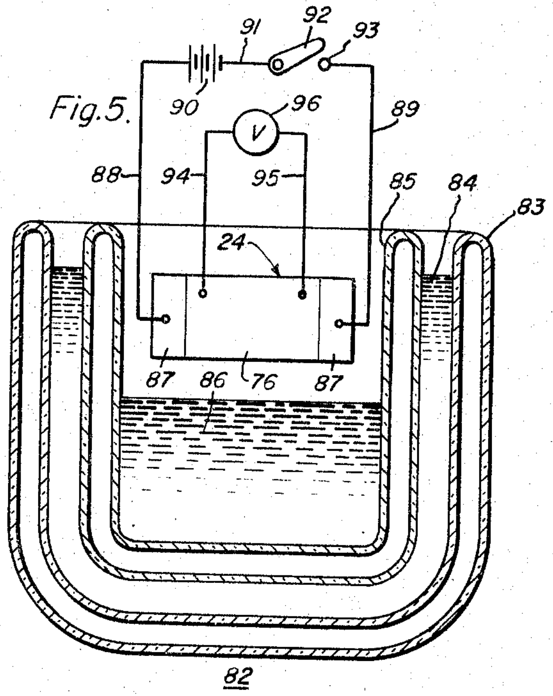
FIGURE 5 is a sectional view of apparatus to determine superconductivity of a superconductive niobium film thereon.

In FIGURE 5 of the drawing, there is shown an insulated container 82 having an exterior insulated vessel 83, an inner insulated vessel 84 separated by liquid nitrogen 85. Within inner vessel 85, there is contained liquid helium 86. A diffusion barrier coated substrate 24 having a superconductive niobium film 76 thereon is positioned by any suitable means (not shown) in a region of helium vapors above liquid helium 86 whereby substrate 24 is maintained at a temperature of 9.4° K., the critical temperature of pure niobium. At opposite ends of superconductive film 76 there is provided a layer of indium solder 87. A pair of leads 88 and 89 are connected to the opposite layers of indium layers 87. Lead 88 is connected to a battery 90 which has a lead 91 from its opposite terminal to a switch 92. Lead 89 has a terminal 93 adapted to be contacted by switch 92. A second pair of leads 94 and 95 are soldered to the superconductive film 76 on substrate 24. These leads are connected to a voltmeter 96.

In the operation of the test apparatus shown in FIGURE 5 of the drawing, switch 92 is closed by contacting terminal 93. Voltmeter 96 provides a reading which indicates whether the film is or is not superconducting at a temperature no lower than 9.4° K. If the voltmeter continues a zero reading, the superconductive niobium film is then known to be superconducting at a temperature no lower than 9.4° K., the critical temperature of pure niobium.

Figure 6:
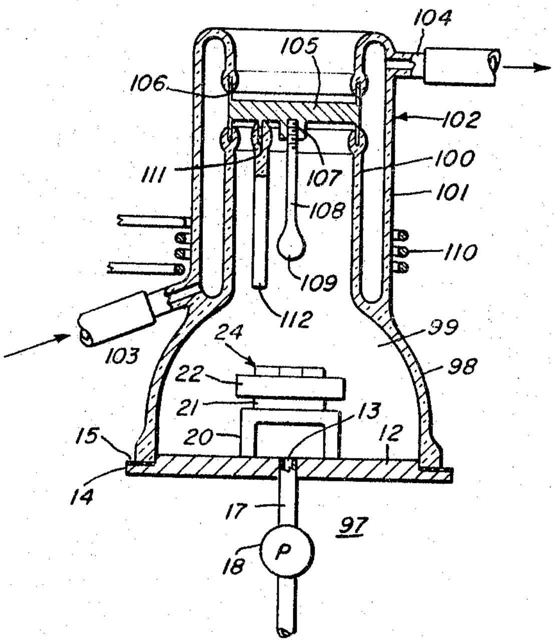
FIGURE 6 is a sectional view of modified apparatus including induction heating.

In FIGURE 6 of the drawing, there is shown modified apparatus 97 for forming superconductive niobium films on diffusion barrier coated beryllium substrates. Metal base 11 has a center portion 12 with central aperture 13 therein and an outer rim 14 on which is positioned a gasket 15. A glass bell jar 98 is positioned on gasket 15 adjacent the edge of center portion 12 of base 11. An evacuation line 17 is connected to aperture 13 and to pump 18 to evacuate a chamber 99 defined by bell jar 98 and center portion 12 of base 11.

A metal member 20 including support legs is positioned over aperture 13. A block 21, such as a quartz, mica or Vycor is located on the top surface of member 20 to provide electrical insulation. A member 22 of quartz, mica or Vycor which has a plurality of heating wires (not shown) embedded therein is positioned on the upper surface of block 21 and extends beyond the edges of member 20 to prevent shorting during operation of the apparatus. A plurality of diffusion barrier coated beryllium substrates 24 are arranged on the upper surface of member 22. The upper portion of bell jar 98 with a diameter less than its lower portion has an inner wall 100 and an outer wall 101 forming a condenser 102. Water is supplied to condenser 102 through water inlet 103 and discharged from water outlet 104. A metal support bracket 105 has a rim 106 at its periphery which is bonded by any suitable means to inner wall 100 of condenser 102. Bracket 105 has a threaded portion 107 which positions the threaded end of a niobium member in the form of a rod 108 of superconductive niobium metal. At the free end of rod 108 there is shown a globule 109 of niobium which is formed during a previous melting of the tip of rod 108. An induction coil 110 surrounds a portions of the exterior wall of condenser 102 adjacent the tip of rod 109. A projection 111 from bracket 105 carries a glass rod 112 which is at least the length of rod 109.

Induction coil 110 is provided to heat and melt at least a part of the superconductive niobium metal in rod 109. For simplification, the apparatus and circuitry for heating wires 23 in member 22, which are shown in FIGURE 1, are not repeated in FIGURE 5. Shield 74, with its associated equipment, is also not shown in this figure of the drawing for the same reason. However, it is to be understood that these parts of the apparatus, which are disclosed in FIGURE 1 of the drawing and described above, are also applicable to the apparatus shown in FIGURE 5.

In the operation of the apparatus shown in FIGURE 5 of the drawing, a plurality of beryllium substrates 24, which have been provided with a diffusion barrier coating such as beryllium oxide or tungsten, are positioned adjacent one another on a Vycor member 22. Member 22 is positioned on an electrically insulated block 21 which is supported on a metallic member 20. A niobium rod 109 is threaded in support bracket 105 and glass rod 112 is carried by this bracket. Bell jar 98 is positioned on rubber gasket 15 and its inner edge is adjacent to center portion 12 of base member 11. The tip of rod 108 is positioned within and surrounded by induction coil 110 which is located around the exterior wall of condenser 102. Water is flowed through the condenser during operation to cool bell jar 98.

Pump 18 evacuates chamber 99 through exit line 17 to a pressure in the range of $1\times10^{-9}$ to $5\times10^{-5}$ millimeters of mercury. Coated substrates 24 are positioned approximately one inch from the end of rod 108. Induction coil 110 is energized from a variable power source (not shown) to heat and melt at least a part of the superconducting niobium metal in rod 108 as shown, for example, by globule 109. A portion of niobium metal from globule 109 of rod 108 is evaporated on the interior surface of chamber 99 and on substrates 24. The initial portion of the evaporated metal getters oxygen and oxygen containing compounds within chamber 99. Glass rod 112 casts a shadow on the interior of inner wall 100 of condenser 102 to prevent a continuous annular deposit of metal on wall 100. In this manner, effective heating and melting of a portion of rod 108 is accomplished. The subsequent evaporation of an additional portion of niobium metal and its condensation on the coated substrates forms a superconductive niobium film. Coated substrates 24 are maintained at a temperature of approximately 300° C. by the heat from globule 109 at the tip of rod 108. These coated substrates must be heated to a temperature in excess of 25° C., to have the condensed niobium film exhibit the superconductive properties of pure niobium when cooled below its critical temperature.

The induction heating is terminated and the chamber 99 is allowed to cool to room temperature. After the chamber is returned to atmospheric pressure, bell jar 98 is removed therefrom. The coated substrates 24 with superconductive niobium films thereon are then removed from chamber 99. Shield 74, which is also shown in FIGURE 1, can be employed in apparatus 97 during the formation of superconducitve niobium films.

Coated substrate 24, which is employed in apparatus 97, is shown in FIGURE 3 of the drawing wherein a superconductive niobium film 77 is evaporated thereon. Coated cylinder 78, which is shown in FIGURE 4 of the drawing, could also be employed in apparatus 97 to evaporate a superconductive niobium film 81 on the exterior side wall of the cylinder. The test apparatus of FIGURE 5 is also used to determine whether the evaporated niobium film is superconducting at a critical temperature no lower than the critical temperature of pure niobium.

Examples of methods of forming superconductive niobium films in accordance with the present invention are as follows:

*Example I*

Apparatus is set up in accordance with FIGURE 1 of the drawing. A plurality of beryllium substrates are exposed to an air atmosphere for a period of thirty minutes at 900° C. to form a diffusion barrier coating of beryllium oxide thereon which has a thickness of about 0.001 inch. These coated beryllium substrates are positioned on the electrically insulated member supported on the base member. A niobium rod containing 99.9 weight percent niobium is employed as the metallic member from which niobium is evaporated onto the substrates. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrates are positioned approximately one inch from the end of the niobium rod. The tungsten wire surrounding the end of the rod is heated from a 16 volt, 18 ampere power source. A 300 ma., 3000 volt D.C. variable power supply is connected to the niobium rod and the molybdenum wire screen surrounding the rod which is maintained at a negative potential of minus 500 volts to provide electron bombardment heating of the niobium rod. The rapid evaporation is continued for a period of sixty minutes. The substrates are maintained at a temperature of approximately 700° C. from heat provided by the molten end of the niobium rod. At the end of this time, the power supplies are discontinued and the apparatus is allowed to cool to room temperature. The chamber is then returned to atmospheric pressure. The bell jar is removed from the rubber gasket to provide access to the substrates therein. Each of these substrates has a film of niobium which is one micron in thickness. Subsequently, one of these coated substrates with the niobium film thereon is tested in the apparatus shown in FIGURE 5 of the drawing. Prior to testing this substrate, a coating of indium solder is applied at opposite ends on the surface of the niobium film. A pair of leads are connected to the respective indium solder portions and to a battery and associated switch. A second pair of leads are soldered at spaced-apart points on the niobium film. These leads are connected to a voltmeter. The substrate is then positioned in a region of helium vapors above liquid helium contained in an insulated container whereby the substrate is maintained at a temperature of 9.4° K. The switch is closed to activate the battery to provide a flow of current through the superconducting film. The voltmeter registers zero volts disclosing that the film is superconducting at a critical temperature no lower than the critical temperature of pure niobium.

*Example II*

Apparatus is set up in accordance with FIGURE 1 of the drawing. A plurality of beryllium substrates are provided with a 0.001 inch thick coating of tungsten by vapor depositing the tungsten thereon, thereby forming a diffusion barrier coating on the beryllium substrates. These coated beryllium substrates are positioned on the electrically insulated member supported on the base member. A niobium rod having a diameter of ⅛ inch is employed as the metallic member from which niobium is evaporated on the substrates. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrates are positioned approximately one inch from the end of the niobium rod. The tungsten wire surrounding the end of the rod is heated from a 16 volt, 18 ampere power source. A 300 ma., 3000 volt D.C. variable power supply is connected to the niobium rod and the molybdenum wire screen surrounding the rod which is maintained at a negative potential of minus 500 volts to provide electron bombardment heating of the niobium rod. The rapid evaporation is continued for a period of approximately sixty minutes. The substrates are maintained at a temperature of approximately 700° C. from heat provided by the molten end of the niobium rod. At the end of this time, the power sources are discontinued and the apparatus is allowed to cool to room temperature. The chamber is then returned to atmospheric pressure. The bell jar is removed from the rubber gasket to provide access to the substrates therein. Each of these substrates has a film of niobium which was one micron in thickness. Subsequently, one of these coated substrates with the niobium film thereon is tested in the apparatus shown in FIGURE 5 of the drawing. Prior to testing this substrate, a coating of indium solder is applied at opposite ends on the surface of the niobium film. A pair of leads are connected to the respective indium solder portions and to a battery and associated switch. A second pair of leads are soldered at spaced-apart points on the niobium film. These leads are connected to a voltmeter. The substrate is then positioned in a region of helium vapors above liquid helium contained in an insulated container whereby the substrate is maintained at a temperature of 9.4° K. The switch is closed to activate the battery to provide a flow of current through the superconducting film. The voltmeter registers zero volts disclosing that the film is superconducting at a critical temperature no lower than the critical temperature of pure niobium.

*Example III*

Apparatus is set up in accordance with FIGURE 1 of the drawing. A plurality of beryllium substrates are exposed to an air atmosphere for a period of thirty minutes at 900° C. to form a diffusion barrier coating of beryllium oxide thereon, which has a thickness of about 0.001 inch. The coated beryllium substrates are positioned on the electrically insulated member supported on the base member. A niobium rod having a diameter of ⅛ inch is employed as the metallic member from which niobium evaporated on the substrates. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrates are positioned approximately one inch from the end of the niobium rod. The tungsten wire surrounding the end of the rod is heated from a 16 volt, 18 ampere power source. A 300 ma., 3000 volt D.C. variable power supply is connected to the tantalum rod and surrounding the rod which is maintained at a negative potential of minus 500 volts to provide electron bombardment heating of the niobium rod. A molybdenum shield is positioned initially between the end of the rod and the substrates. The rapid evaporation is commenced. After ten minutes, the shield is removed. The rapid evaporation is continued for a total period of sixty minutes. The substrates are maintained at a temperature of approximately 700° C. from heat provided by the molten end of the niobium rod. At the end of this time, the power supplies are discontinued and the apparatus is allowed to cool to room temperature. The chamber is then returned to atmosperic pressure. The bell jar is removed from the rubber gasket to provide access to the substrates therein. Each of these substrates has a film of niobium which was one micron in thickness. Subsequently, one of these coated substrates is tested in the apparatus shown in FIGURE 5 of the drawing. Prior to testing this substrate, a coating of indium solder is applied at opposite ends on the surface of the niobium film. A second pair of leads are connected to the respective indium solder portions and to a battery and associated switch. A second pair of leads are soldered at spaced-apart points on the tantalum film. These leads are connected to a voltmeter. The substrate is then positioned in a region of helium vapors above liquid helium contained in an insulated container whereby the substrate is maintained at a temperature of 9.4° K. The switch is closed to activate the battery to provide a flow of current through the superconducting film. The voltmeter registers zero volts disclosing that the film is superconducting at a critical temperature no lower than the critical temperature of pure niobium.

While other modifications of the invention and variations of method which may be employed in the scope of the invention have not been described, the invention is intended to include such that may be embraced within the following claims.

What we claim as new and desire to secure by Letters Patent of the United States is:

1. A method for forming a superconductive niobium film on a beryllium substrate which comprises providing a beryllium substrate, forming a diffusion barrier coating selected from the group consisting of beryllium oxide and tungsten on said substrate, positioning said coated substrate within a chamber, evacuating said chamber to a pressure in the range of $1\times10^{-9}$ to $5\times10^{-5}$ millimeters of mercury, positioning a niobium member within said chamber, heating at least a part of said member to at least its melting point, heating said coated substrate to a temperature in excess of 25° C., evaporating an initial portion of the resulting molten member within said chamber thereby gettering oxygen and oxygen containing compounds therein, and subsequently evaporating an additional portion of said molten member and condensing on said coated substrate a superconductive niobium film.

2. A method of forming a superconductive niobium film on a beryllium substrate which comprises providing a beryllium substrate, forming a diffusion barrier coating selected from the group consisting of beryllium oxide and tungsten on said substrate, positioning said coated substrate within a chamber, evacuating said chamber to a pressure range of $1\times10^{-9}$ to $5\times10^{-5}$ millimeters of mercury, positioning a niobium member within said chamber, positioning a shield between said substrate and said member, heating at least a part of said member to at least its melting point, heating said coated substrate to a temperature in excess of 25° C., evaporating an initial portion of the resulting molten member within said chamber thereby gettering oxygen and oxygen containing compounds therein, removing said shield, and subsequently evaporating an additional portion of said molten member and condensing on said coated substrate a superconductive niobium film.

3. A method of forming a superconductive niobium film on a beryllium substrate which comprises providing a beryllium substrate, forming a beryllium oxide coating on said substrate, positioning said oxide coated substrate within a chamber, evacuating said chamber to a pressure in the range of $1\times10^{-9}$ to $5\times10^{-5}$ millimeters of mercury, positioning a niobium member within said chamber, heating at least a part of said member to at least its melting point, heating said coated substrated to a temperature in excess of 25° C., evaporting an initial portion of the resulting molten member within said chamber thereby gettering oxygen and oxygen containing compounds therein, and subsequently evaporating an additional portion of said molten member and condensing on said coated substrate a superconductive niobium film.

4. A method of forming a superconductive niobium film on a beryllium substrate which comprises providing a beryllium substrate, forming a tungsten coating on said substrate, positioning said tungsten coated substrate within a chamber, evacuating said chamber to a pressure in the range of $1\times10^{-9}$ to $5\times10^{-5}$ millimeters of mercury, positioning a niobium member within said chamber, heating at least a part of said member to at least its melting point, heating said coated substrate to a temperature in excess of 25° C., evaporating an inital portion of the resulting molten member within said chamber thereby gettering oxygen and oxygen containing compounds therein, and subsequently evaporating an additional portion of said molten member and condensing on said coated substrate a superconductive niobium film.

No references cited.

ALFRED L. LEAVITT, *Primary Examiner.*

W. L. JARVIS, *Assistant Examiner.*